(12) United States Patent
Lee

(10) Patent No.: US 10,773,947 B2
(45) Date of Patent: Sep. 15, 2020

(54) CMOS MEMS INTEGRATED DEVICE WITH INCREASED SHIELD VERTICAL GAP

(71) Applicant: InvenSense, Inc., San Jose, CA (US)

(72) Inventor: Daesung Lee, San Jose, CA (US)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 16/382,102

(22) Filed: Apr. 11, 2019

(65) Prior Publication Data

US 2019/0382261 A1 Dec. 19, 2019

Related U.S. Application Data

(60) Provisional application No. 62/687,207, filed on Jun. 19, 2018.

(51) Int. Cl.
*B81B 3/00* (2006.01)

(52) U.S. Cl.
CPC .... *B81B 3/0016* (2013.01); *B81B 2201/0235* (2013.01); *B81B 2201/0242* (2013.01); *B81B 2207/012* (2013.01)

(58) Field of Classification Search
CPC ... B81B 3/0016; B81B 7/007; B81B 2203/04; B81B 2207/012
See application file for complete search history.

(56) References Cited

U.S. PATENT DOCUMENTS

| | | | |
|---|---|---|---|
| 9,540,228 B2 | 1/2017 | Smeys et al. | |
| 10,081,539 B2 | 9/2018 | Lee et al. | |
| 2016/0221819 A1 | 8/2016 | Smeys et al. | |
| 2017/0297911 A1 | 10/2017 | Shin et al. | |
| 2018/0016135 A1* | 1/2018 | Lee | B81C 1/00238 |

* cited by examiner

*Primary Examiner* — Daniel P Shook

(57) ABSTRACT

An apparatus includes a MEMS wafer with a device layer and a handle substrate bonded to the device layer. A complementary metal-oxide semiconductor ("CMOS") wafer includes an oxide layer, and a passivation layer overlying the oxide layer. A bonding electrode overlies the passivation layer. A eutectic bond is between a first bonding metal on the bonding electrode and a second bonding metal on the MEMS wafer. A sensing electrode overlies the passivation layer. A shield electrode is adjacent to the sensing electrode. A sensing gap is positioned between the sensing electrode and the device layer, wherein the sensing gap is smaller than a shield gap positioned between the shield electrode and the device layer.

21 Claims, 17 Drawing Sheets

1400

```
┌─────────────────────────────────────────────────────────────┐
│ FORMING A MEMS WAFER INCLUDING A DEVICE LAYER AND A HANDLE  │
│         SUBSTRATE BONDED TO THE DEVICE LAYER                │
│                           1402                              │
└─────────────────────────────────────────────────────────────┘
                              │
┌─────────────────────────────────────────────────────────────┐
│    FORMING A CMOS WAFER INCLUDING AN OXIDE LAYER, AND A     │
│       PASSIVATION LAYER OVERLYING THE OXIDE LAYER           │
│                           1404                              │
└─────────────────────────────────────────────────────────────┘
                              │
┌─────────────────────────────────────────────────────────────┐
│ FORMING A BONDING ELECTRODE OVERLYING THE PASSIVATION LAYER,│
│ A SENSING ELECTRODE OVERLYING THE PASSIVATION LAYER, AND A  │
│      BUMP STOP ELECTRODE OVERLYING THE PASSIVATION LAYER    │
│                           1406                              │
└─────────────────────────────────────────────────────────────┘
                              │
┌─────────────────────────────────────────────────────────────┐
│ ETCHING THE PASSIVATION LAYER AND THE OXIDE LAYER, WHEREIN  │
│       THE ETCHING EXPOSES A SHIELD ELECTRODE                │
│                           1408                              │
└─────────────────────────────────────────────────────────────┘
                              │
┌─────────────────────────────────────────────────────────────┐
│ EUTECTICLY BONDING THE MEMS WAFER TO THE CMOS WAFER, WHEREIN│
│   THE EUTECTICLY BONDING INCLUDES FORMING A EUTECTIC BOND   │
│ BETWEEN A FIRST BONDING METAL ON THE BONDING ELECTRODE AND A│
│  SECOND BONDING METAL ON THE MEMS WAFER, THE EUTECTICLY     │
│ BONDING FORMS A SENSING GAP BETWEEN THE SENSING ELECTRODE   │
│AND THE DEVICE LAYER, THE EUTECTICLY BONDING FORMS A SHIELD  │
│GAP BETWEEN THE SHIELD ELECTRODE AND THE DEVICE LAYER, AND   │
│     THE SENSING GAP IS SMALLER THAN THE SHIELD GAP          │
│                           1410                              │
└─────────────────────────────────────────────────────────────┘
```

CMOS MEMS INTEGRATED DEVICE WITH INCREASED SHIELD VERTICAL GAP

CROSS-REFERENCE TO RELATED APPLICATIONS

This application claims the benefit of U.S. Provisional Patent Application Ser. No. 62/687,207 filed Jun. 19, 2018, entitled "CMOS MEMS INTEGRATED DEVICE WITH INCREASED SHIELD VERTICAL GAP".

BACKGROUND

MEMS ("micro-electro-mechanical systems") are a class of devices that are fabricated using semiconductor-like processes and exhibit mechanical characteristics. For example, MEMS devices may include the ability to move or deform. In many cases, but not always, MEMS interact with electrical signals. A MEMS device may refer to a semiconductor device that is implemented as a micro-electro-mechanical system. A MEMS device includes mechanical elements and may optionally include electronics (e.g. electronics for sensing). MEMS devices include but are not limited to, for example, gyroscopes, accelerometers, magnetometers, pressure sensors, etc. As technology advances, it is desirable to reduce the offset shift over time of MEMS devices, reduce the occurrence of stiction, and reduce the size of the MEMS devices.

SUMMARY

Provided herein is an apparatus including a MEMS wafer with a device layer and a handle substrate bonded to the device layer. A complementary metal-oxide semiconductor ("CMOS") wafer includes an oxide layer, and a passivation layer overlying the oxide layer. A bonding electrode overlies the passivation layer. A eutectic bond is between a first bonding metal on the bonding electrode and a second bonding metal on the MEMS wafer. A sensing electrode overlies the passivation layer. A shield electrode is adjacent to the sensing electrode. A sensing gap is positioned between the sensing electrode and the device layer, wherein the sensing gap is smaller than a shield gap positioned between the shield electrode and the device layer. These and other features and advantages will be apparent from a reading of the following detailed description.

2

Figure 8:
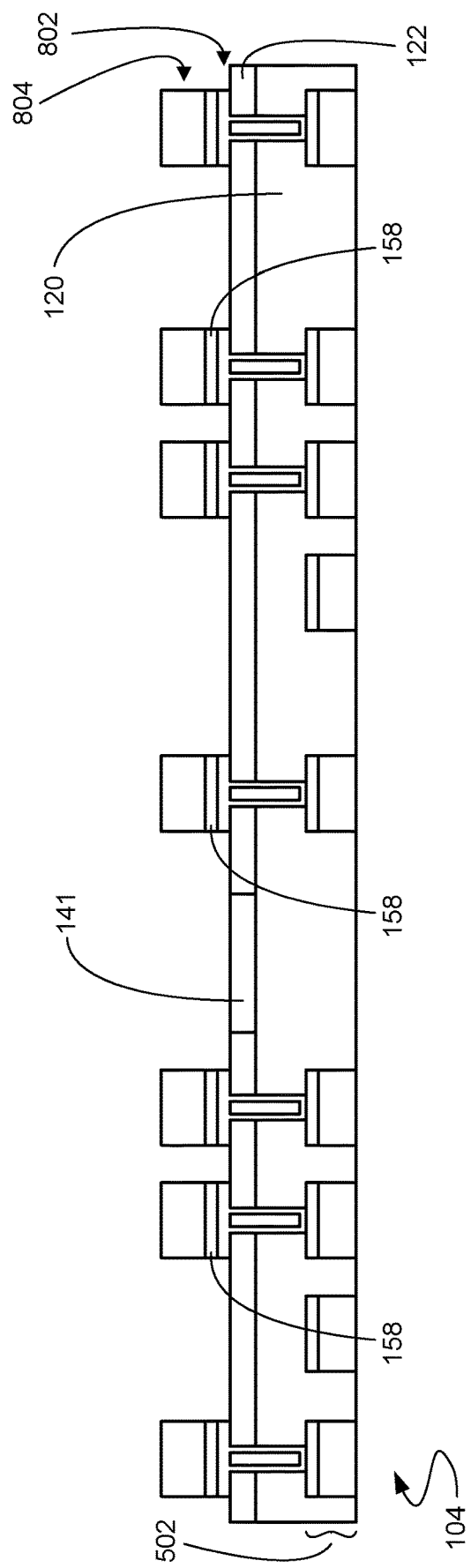

FIG. 8 shows the CMOS wafer after electrode deposition and patterning according to one aspect of the present embodiments.

Figure 9:
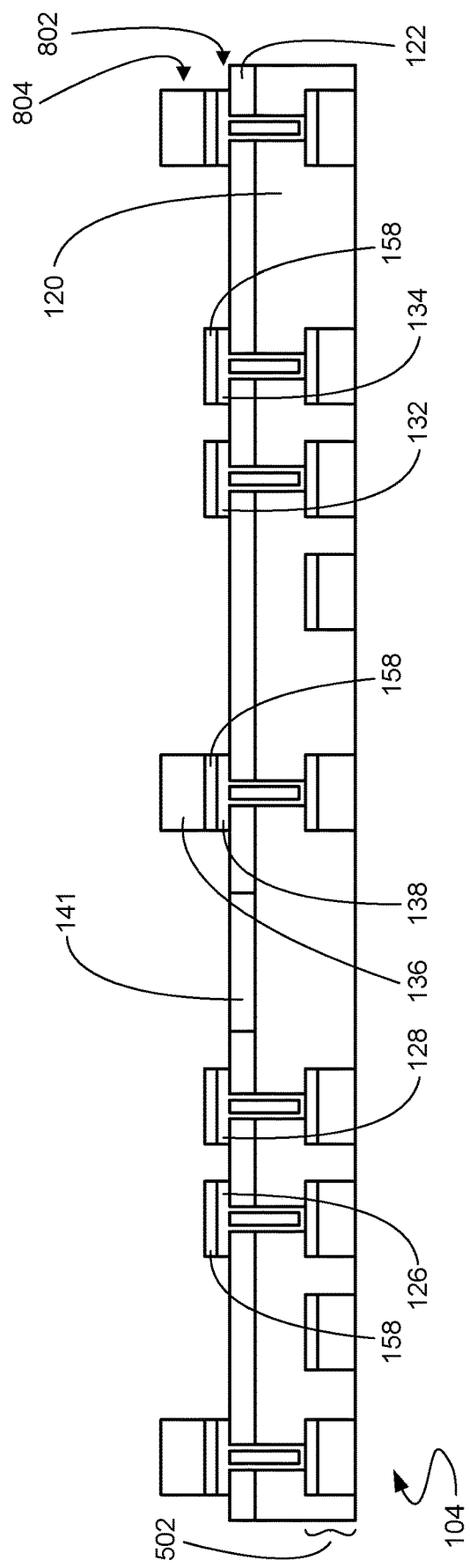

FIG. 9 shows the CMOS wafer after selective etch of the first bonding metal layer according to one aspect of the present embodiments.

Figure 10:
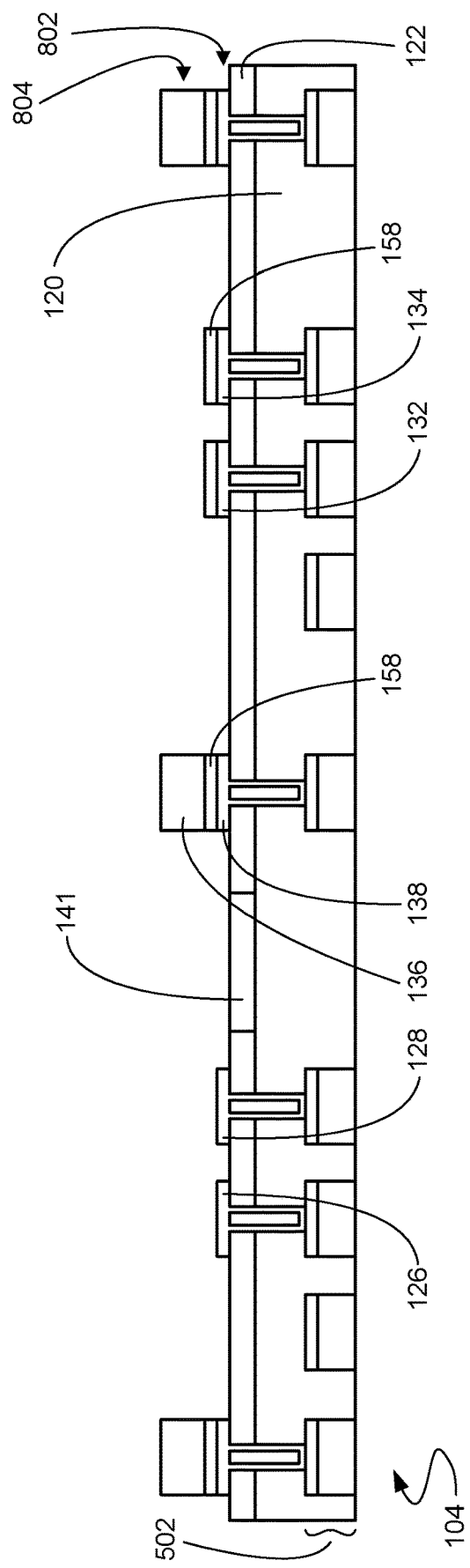

FIG. 10 shows the CMOS wafer after selective etch of the getter layer according to one aspect of the present embodiments.

Figure 11A:
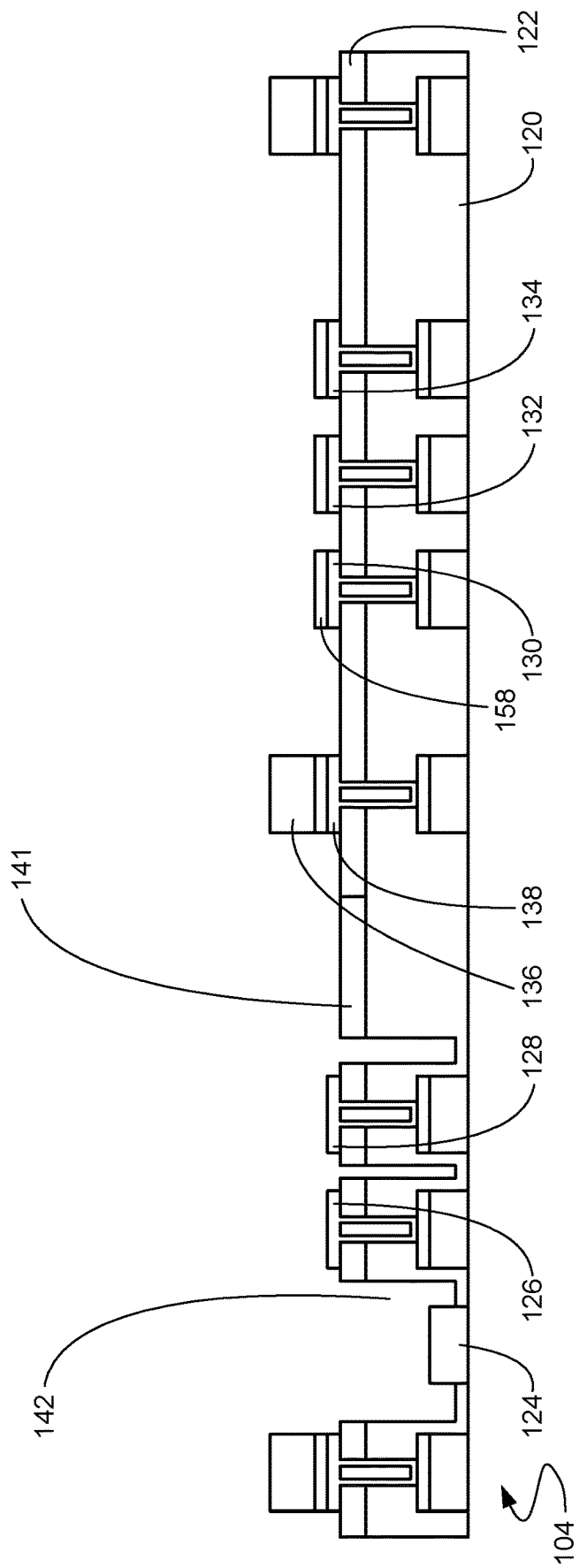

FIG. 11A shows Process A of the CMOS wafer after passivation etch according to one aspect of the present embodiments.

Figure 11B:
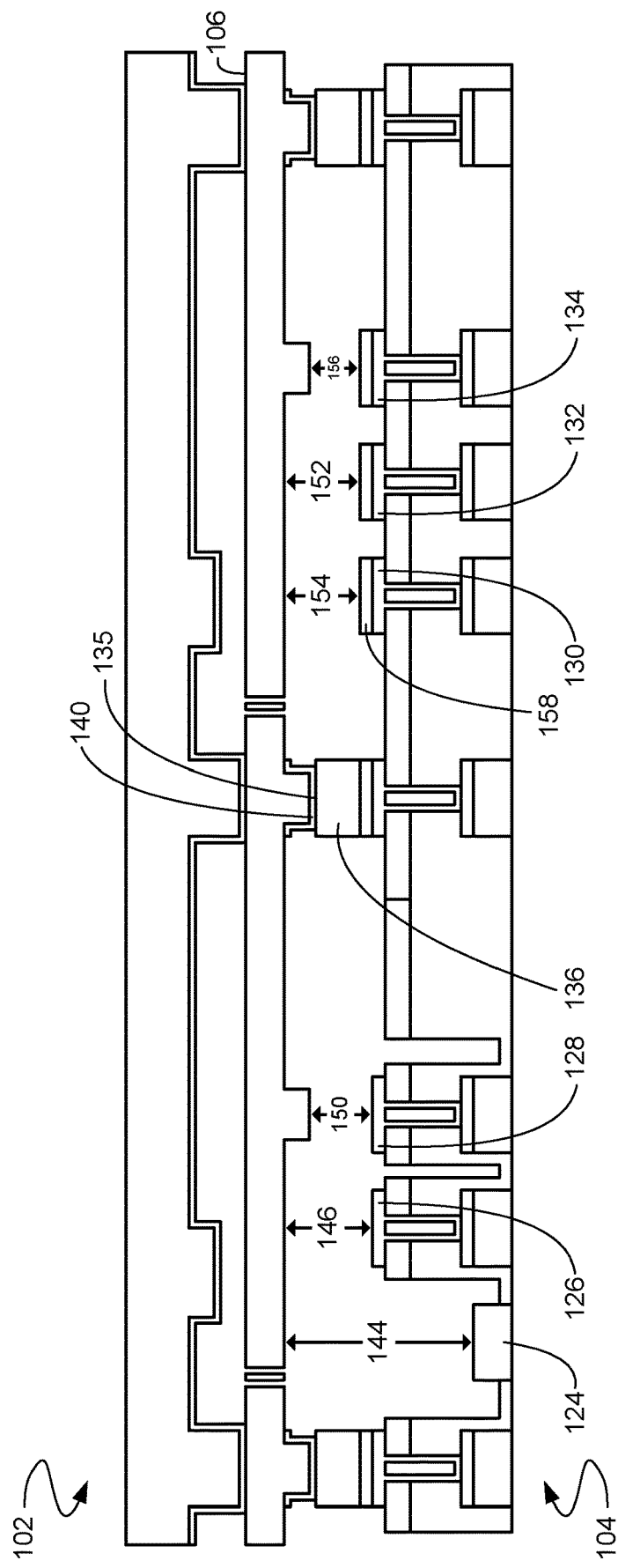

FIG. 11B shows Process A of the CMOS wafer and the MEMS wafer after eutectic bonding according to one aspect of the present embodiments.

Figure 12A:
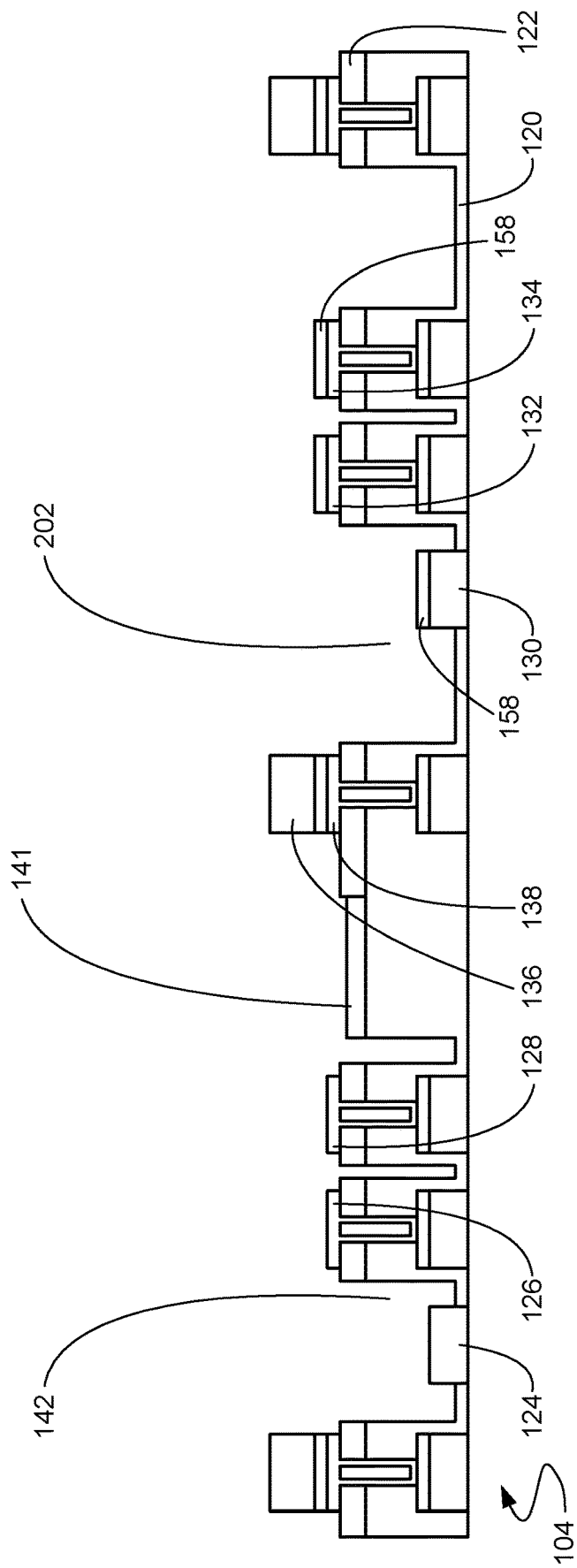

FIG. 12A shows Process B of the CMOS wafer after passivation etch according to one aspect of the present embodiments.

Figure 12B:
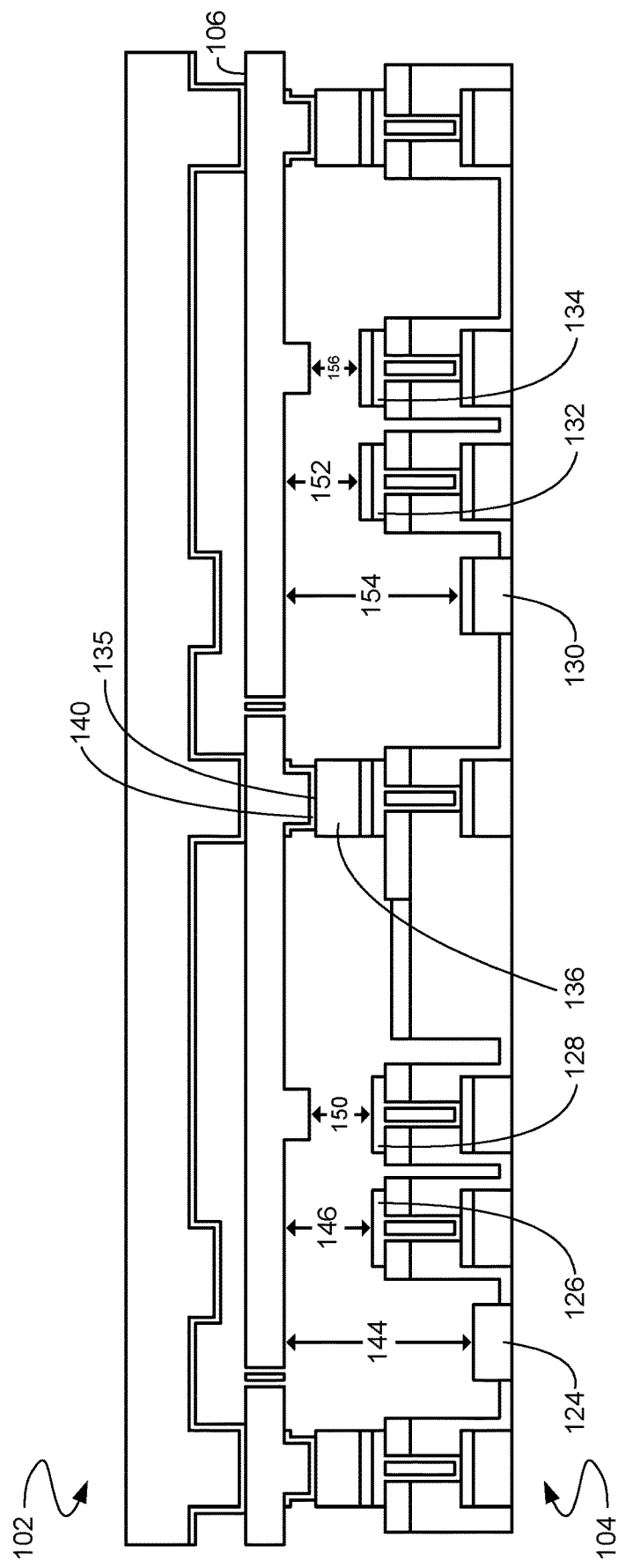

FIG. 12B shows Process B of the CMOS wafer and the MEMS wafer after eutectic bonding according to one aspect of the present embodiments.

Figure 13A:
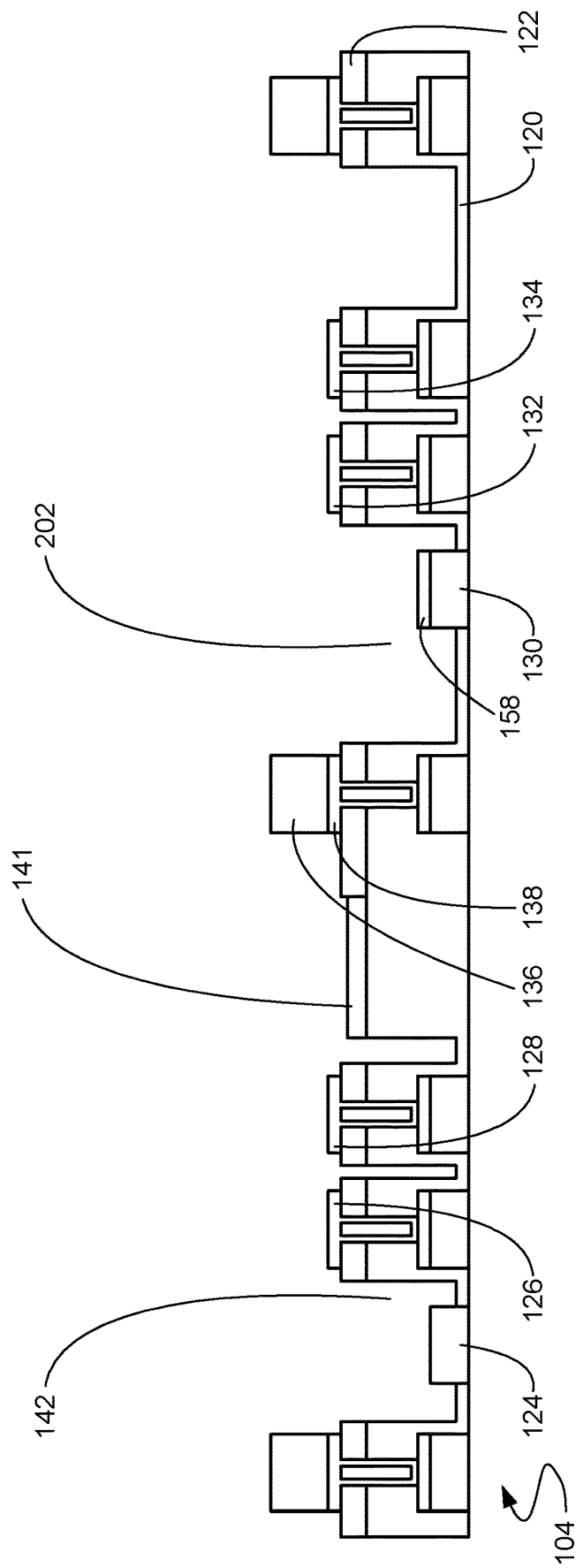

FIG. 13A shows Process C of the CMOS wafer after passivation etch according to one aspect of the present embodiments.

Figure 13B:
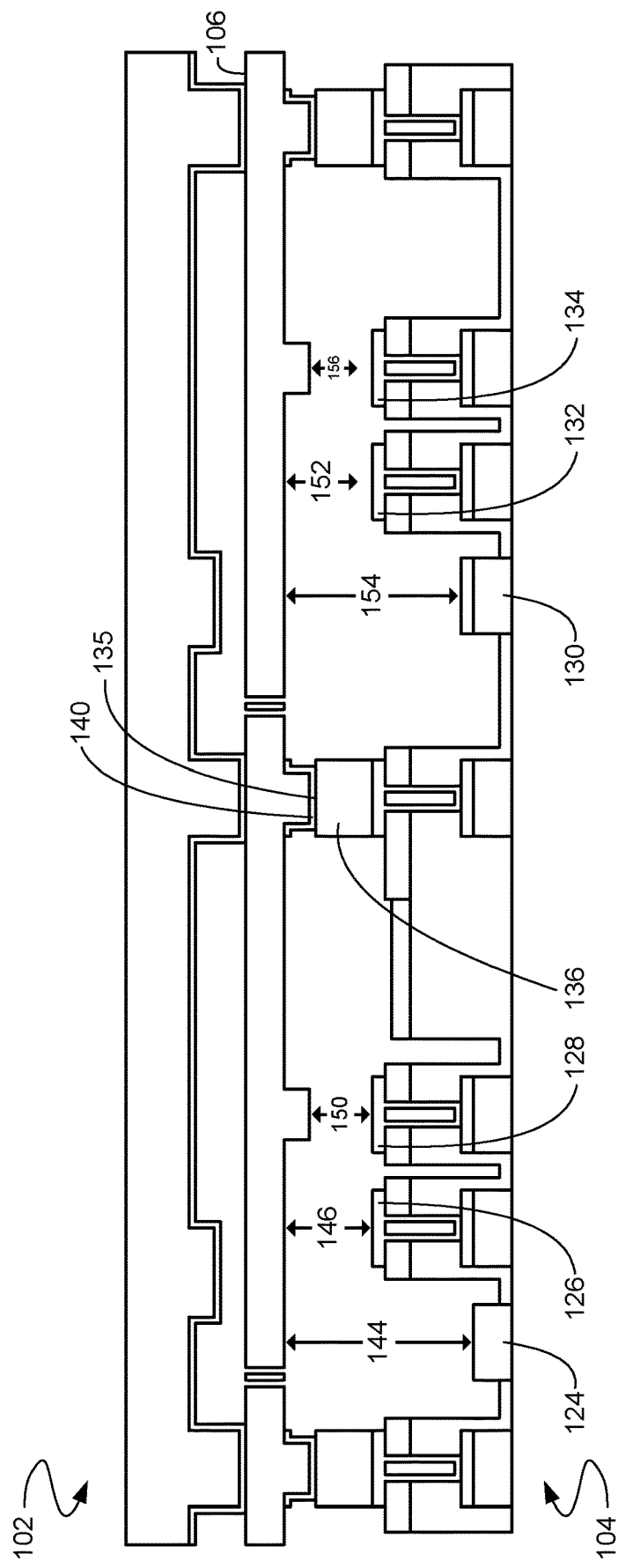

FIG. 13B shows Process C of the CMOS wafer and the MEMS wafer after eutectic bonding according to one aspect of the present embodiments.

FIG. 14 shows an exemplary flow diagram according to one aspect of the present embodiments.

DESCRIPTION

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

A MEMS device includes mechanical elements and may optionally include electronics (e.g. electronics for sensing). MEMS devices include but are not limited to, for example, gyroscopes, accelerometers, magnetometers, pressure sensors, etc. During fabrication, it may be desirable to create various different MEMS devices on the same wafer. As technology advances, it is desirable to reduce the offset shift over time of MEMS devices, reduce the occurrence of stiction, and reduce the size of the MEMS devices. According to embodiments described herein, the shield electrode is positioned further away from the device layer by placing the shield electrode in a cavity in the CMOS wafer. In addition, in some embodiments the shield electrode does not have a layer of TiN, thereby reducing getter action. The positioning of the shield electrode and the reduction of getter action results in a reduction of offset shift over time, and reduction of the occurrence of stiction.

Figure 1:
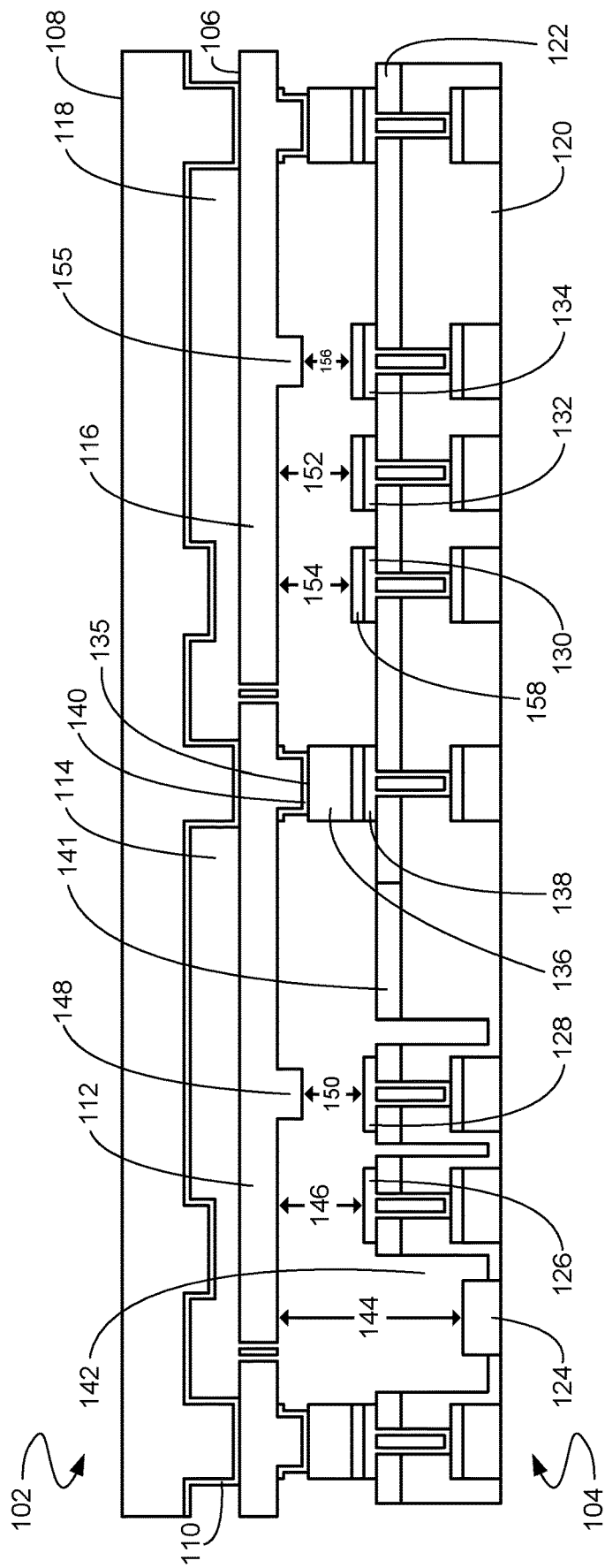
FIG. 1 shows a first embodiment of a MEMS wafer eutecticly bonded to a CMOS wafer according to one aspect of the present embodiments.

Referring now to FIG. 1, a first embodiment of a MEMS wafer 102 eutecticly bonded to a CMOS wafer 104 is shown according to one aspect of the present embodiments. The MEMS wafer 102 includes a device layer 106 and a handle substrate 108 that are bonded together, for example with a fusion bond 110. The MEMS wafer 102 may include a first MEMS device 112 (e.g. an accelerometer) with a corresponding first MEMS cavity 114 (e.g. an accelerometer cavity). The MEMS wafer may also include one or more additional MEMS devices, such as a second MEMS device 116 (e.g. a gyroscope) with a corresponding second MEMS cavity 118 (e.g. a gyroscope cavity). It is understood that the first MEMS device 112 and the second MEMS device 116 may the same or different devices, and the MEMS devices may include any MEMS device (e.g. gyroscopes, accelerometers, magnetometers, pressure sensors, etc.).

The CMOS wafer 104 may include an oxide layer 120 and a passivation layer 122 overlying the oxide layer 120. The CMOS wafer 104 may also include a shield electrode 124 (e.g. a first shield electrode), a sensing electrode 126 (e.g. a first sensing electrode), and/or a bump stop electrode 128 (e.g. a first bump stop electrode) corresponding to the first MEMS device 112. In addition, the CMOS wafer 104 may include a shield electrode 130 (e.g. a second shield electrode), a sensing electrode 132 (e.g. a second sensing electrode), and/or a bump stop electrode 134 (e.g. a second bump stop electrode) corresponding to the second MEMS device 116. In the illustrated embodiment, the shield electrode 124, the sensing electrode 126, and the bump stop electrode 128 are positioned under the first MEMS device 112. In addition, the shield electrode 130, the sensing electrode 132, and the bump stop electrode 134 are positioned under the second MEMS device 116.

It is understood that various embodiments may include one or more of the electrodes 124, 126, 128, 130, 132 and/or 134, and that not all the electrodes may be present in every embodiment. In addition, it is understood that various embodiments may include the electrodes 124, 126, 128, 130, 132 and/or 134 in various combinations (e.g. the bump stop electrode 128 may be between the shield electrode 124 and the sensing electrode 126, the shield electrode 124 may be between the bump stop electrode 128 and the sensing electrode 126, the sensing electrode 126 may be between the shield electrode 124 and the bump stop electrode 128, etc.).

The MEMS wafer 102 and the CMOS wafer 104 are connected by a eutectic bond 135 between a first bonding metal 136 on a bonding electrode 138 of the CMOS wafer 104 and a second bonding metal 140 on the device layer 106 of the MEMS wafer 102. In various embodiments the eutectic bond 135 hermetically seals a MEMS device (e.g. first MEMS device 112, second MEMS device 116, and/or others) and may separate one MEMS device from another MEMS device (e.g. as illustrated the eutectic bond 135 separates the first MEMS device 112 from the second MEMS device 116). In some embodiments, with the first MEMS device 112, an outgassing region 141 is within the passivation layer 122 and overlies a portion of the oxide layer 120.

In various embodiments, the shield electrode 124 may be formed in a third cavity 142. The third cavity 142 is a cavity formed in the oxide layer 120 of the CMOS wafer 104. As a result, the shield electrode 124 is further away from the device layer 106 and the first MEMS device 112. In the illustrated embodiment, the first MEMS device 112 is an accelerometer. The positioning of the shield electrode 124 results in less offset shift of the accelerometer over time, due to less capacitance resulting from the increased distance between the shield electrode 124 and the accelerometer. Furthermore, the positioning of the shield electrode 124 reduces hillock growth related failures (e.g. shield to proof mass short).

In addition, in the illustrated embodiment, stiction is reduced by the positioning of the shield electrode 124 as well as forming the shield electrode 124 without TiN. For example, the shield electrode 124 may be formed from AlCu, without any TiN or any overlying layers of TiN. The reduction of the amount of TiN in the area of the first MEMS device 112 reduces the amount of getter action, thereby reducing stiction and improving the functionality of the first MEMS device 112. Additionally, the positioning of the shield electrode 124 further away from the device layer 106 also reduces stiction and improves the functionality of the first MEMS device 112.

As such, the third cavity 142 in the oxide layer 120 allows the shield electrode 124 to be further away from the device layer 106. For example, with the first MEMS device 112, the shield electrode 124 is separated from the device layer 106 by a shield gap 144, the sensing electrode 126 is separated from the device layer 106 by a sensing gap 146, and the bump stop electrode 128 is separated from a bump 148 on the device layer 106 by a bump stop gap 150. It is understood that the sensing gap 146 is the distance between the sensing electrode 126 and the device layer 106 (e.g. proof mass) of the first MEMS device 112. In addition, the shield gap 144 is the distance between the shield electrode 124 and the device layer 106 (e.g. proof mass) of the first MEMS device 112. The shield electrode 124 is used to apply a voltage similar to the proof mass voltage in order to keep the device from drifting. In various embodiments, the sensing gap 146 and the shield gap 144 are greater than the bump stop gap 150. In addition, the shield gap 144 is greater than the sensing gap 146. Therefore, the sensing gap 146 is smaller than the shield gap 144 positioned between the shield electrode 124 and the device layer 106, and the bump stop gap 150 is smaller than the sensing gap 146 and the shield gap 144.

Likewise, with the second MEMS device 116, the sensing electrode 132 is separated from the device layer 106 by a sensing gap 152, the shield electrode 130 is separated from the device layer 106 by a shield gap 154, and the bump stop electrode 134 is separated from a bump 155 on the device layer 106 by a bump stop gap 156. In some embodiments, a getter layer 158 (also may be referred to as a top electrode layer) overlies the shield electrode 130, the sensing electrode 132, and/or the bump stop electrode 134. In various embodiments, the sensing gap 152 and the shield gap 154 are greater than the bump stop gap 156. In addition, the shield gap 154 is equal to or about equal to the sensing gap 152.

Therefore, in the embodiments described, a larger vertical gap (e.g. the shield gap 144) is defined by actuator (e.g. the device layer 106) to top metal (e.g. the shield electrode 124). In addition, a nominal vertical gap (e.g. the sensing gap 146) is defined by actuator (e.g. the device layer 106) to electrode (e.g. the sensing electrode 146) on passivation (e.g. the passivation layer 122. The nominal vertical gap is lesser (e.g. smaller/shorter) than the larger vertical gap. Furthermore, a smaller vertical gap (e.g. the bump stop gap 150) is defined by standoff (e.g. the bump 148) to electrode (e.g. the bump stop electrode 128) on passivation (e.g. the passivation layer 122). The smaller vertical gap is lesser (e.g. smaller/shorter) than the nominal vertical gap and the larger vertical gap.

Figure 2:
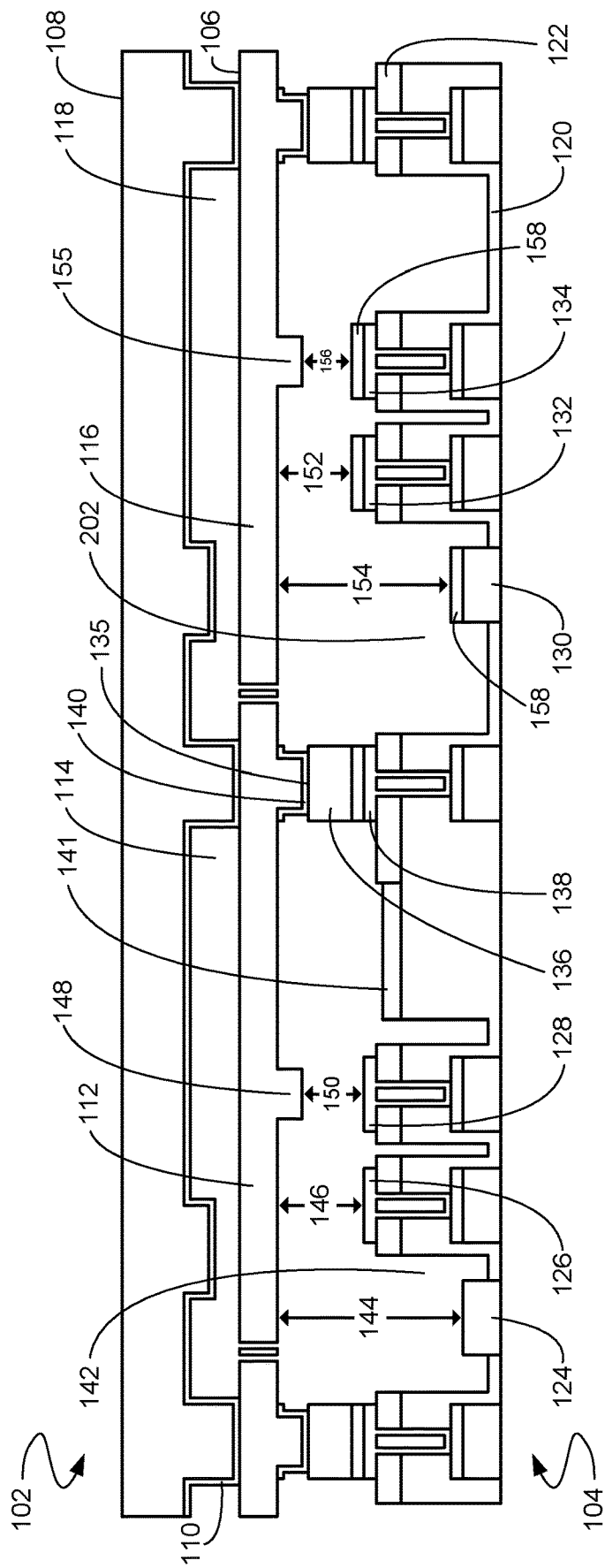
FIG. 2 shows a second embodiment of the MEMS wafer eutecticly bonded to the CMOS wafer according to one aspect of the present embodiments.

Referring now to FIG. 2, a second embodiment of the MEMS wafer 102 eutecticly bonded to the CMOS wafer 104 is shown according to one aspect of the present embodiments. The illustrated second embodiment includes all of the elements of the first embodiment described above. However, in this second embodiment the shield electrode 130 may be formed in a fourth cavity 202. The fourth cavity 202 is a cavity formed in the oxide layer 120 of the CMOS wafer 104. As a result, the shield electrode 130 is further away from the device layer 106 and the second MEMS device 116. In the illustrated embodiment, the second MEMS device 116 is a gyroscope. The positioning of the shield electrode 130 results in less offset shift of the gyroscope over time, due to less capacitance resulting from the increased distance between the shield electrode 130 and the gyroscope.

As such, the fourth cavity 202 in the oxide layer 120 allows the shield electrode 130 to be further away from the device layer 106. For example, with the second MEMS device 116, the shield electrode 130 is separated from the device layer 106 by the shield gap 154, the sensing electrode 132 is separated from the device layer 106 by a sensing gap 152, and the bump stop electrode 134 is separated from the bump 155 on the device layer 106 by the bump stop gap 156. It is understood that the sensing gap 152 is the distance between the sensing electrode 132 and the device layer 106 (e.g. proof mass) of the second MEMS device 116. In addition, the shield gap 154 is the distance between the shield electrode 130 and the device layer 106 (e.g. proof mass) of the second MEMS device 116. The shield electrode 130 is used to apply a voltage similar to the proof mass voltage in order to keep the device from drifting. In various embodiments, the sensing gap 152 and the shield gap 154 are greater than the bump stop gap 156. In addition, the shield gap 154 is greater than the sensing gap 152. Therefore, the sensing gap 152 is smaller than the shield gap 154 positioned between the shield electrode 130 and the device layer 106, and the bump stop gap 156 is smaller than the sensing gap 152 and the shield gap 154. In some embodiments, the getter layer 158 overlies the shield electrode 130, the sensing electrode 132, and/or the bump stop electrode 134.

Therefore, in the embodiments described, the larger vertical gap (e.g. the shield gap 154) is defined by actuator (e.g. the device layer 106) to top metal (e.g. the shield electrode 130 including the getter layer 158). In addition, the nominal vertical gap (e.g. the sensing gap 152) is defined by actuator (e.g. the device layer 106) to electrode (e.g. the sensing electrode 132 including the getter layer 158) on passivation (e.g. the passivation layer 122). The nominal vertical gap is lesser (e.g. smaller/shorter) than the larger vertical gap. Furthermore, the smaller vertical gap (e.g. the bump stop gap 156) is defined by standoff (e.g. the bump 155) to electrode (e.g. the bump stop electrode 134 including the getter layer 158) on passivation (e.g. the passivation layer 122). The smaller vertical gap is lesser (e.g. smaller/shorter) than the nominal vertical gap and the larger vertical gap.

Figure 3:
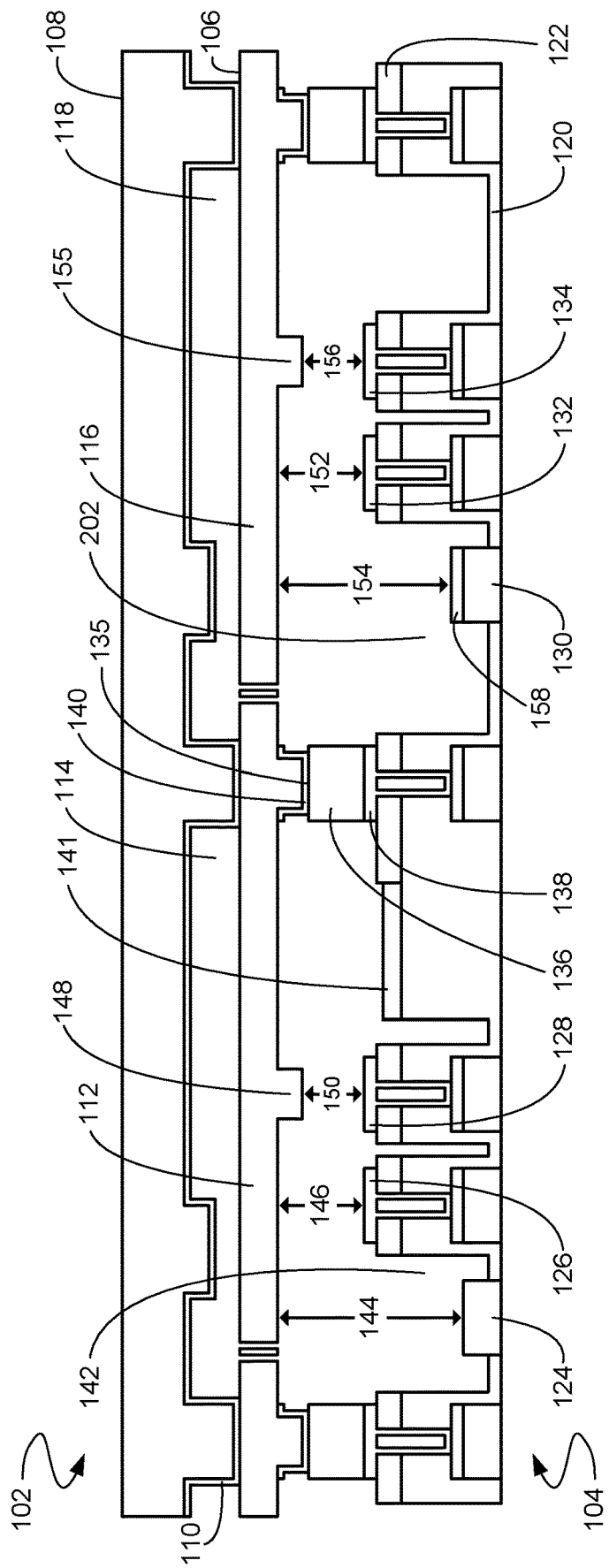
FIG. 3 shows a third embodiment of the MEMS wafer eutecticly bonded to the CMOS wafer according to one aspect of the present embodiments.

Referring now to FIG. 3, a third embodiment of the MEMS wafer 102 eutecticly bonded to the CMOS wafer 104 is shown according to one aspect of the present embodiments. The illustrated third embodiment includes all of the elements of the second embodiment described above. However, in this third embodiment the getter layer 158 only overlies the shield electrode 130. Therefore, in the embodiments described, the larger vertical gap (e.g. the shield gap 154) is defined by actuator (e.g. the device layer 106) to top metal (e.g. the shield electrode 130 including the getter layer 158). In addition, the nominal vertical gap (e.g. the sensing gap 152) is defined by actuator (e.g. the device layer 106) to electrode (e.g. the sensing electrode 132) on passivation (e.g. the passivation layer 122). Furthermore, the smaller vertical gap (e.g. the bump stop gap 156) is defined by standoff (e.g. the bump 155) to electrode (e.g. the bump stop electrode 134) on passivation (e.g. the passivation layer 122).

Figure 4:
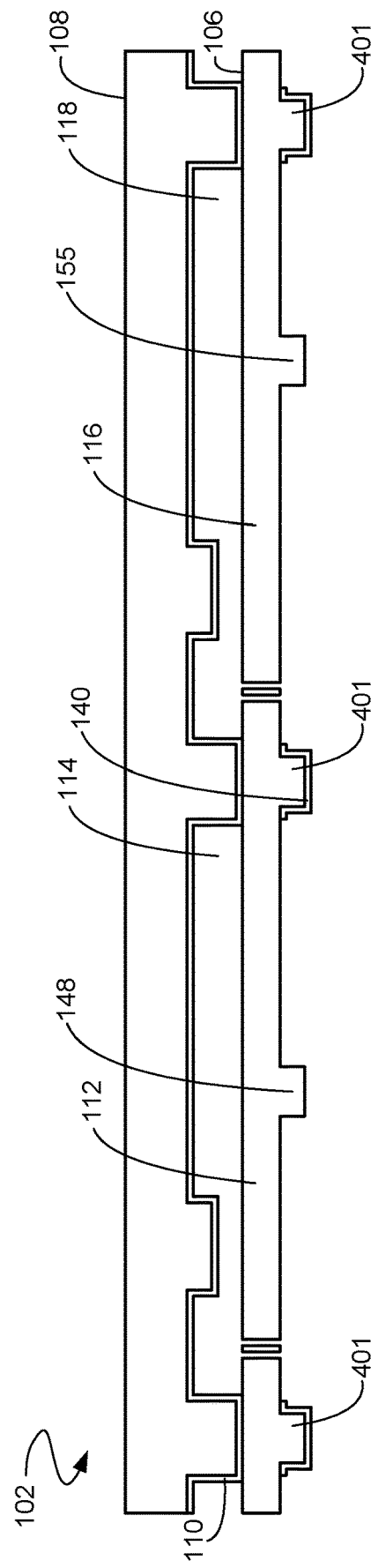
FIG. 4 shows the MEMS wafer before eutectic bonding according to one aspect of the present embodiments.

Referring now to FIG. 4, the MEMS wafer 102 before eutectic bonding is shown according to one aspect of the present embodiments. The first MEMS cavity 114 and the second MEMS cavity 118 have been patterned in the handle substrate 108, and the first MEMS device 112 and the second MEMS device 116 have been patterned in the device layer 106. Fusion bond oxide has been deposited, forming the fusion bond 110 that connects the handle substrate 108 to the device layer 106. Standoffs 401 and the bumps 148, 155 have been patterned on the bottom of the device layer 106, and Ge has been deposited and patterned, forming the second bonding metal 140 on the standoffs 401. It is understood that other metals that can form the eutectic bond 135 (FIG. 2) with the first bonding metal 136 (FIG. 2) may also be used.

Figure 5:
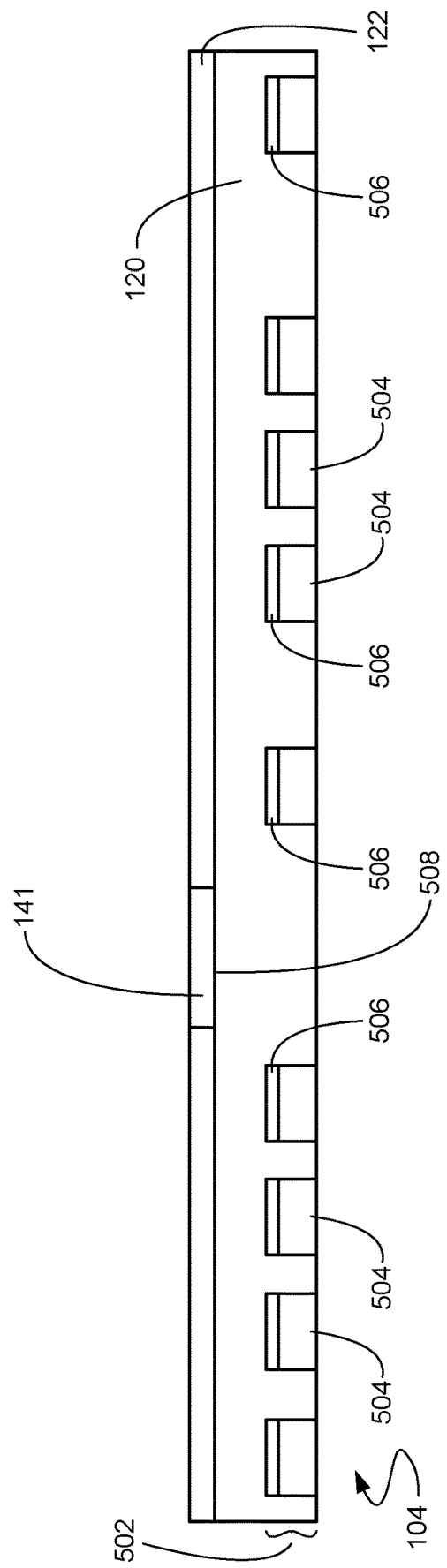
FIG. 5 shows the CMOS wafer before eutectic bonding according to one aspect of the present embodiments.

Referring now to FIG. 5, the CMOS wafer 104 before eutectic bonding is shown according to one aspect of the present embodiments. A metal layer 502 has been deposited and patterned. In various embodiments the metal layer 502 may include one or more layers (e.g. a AlCu layer 504 and an overlying Ti layer 506).

At this stage of manufacture the oxide layer 120 surrounds and overlies the metal layer 502. In addition, the outgassing region 141 overlies a portion 508 of the oxide layer 120. The outgassing region may include, for example, high density plasma ("HDP") oxide, and may be referred to as an HDP module. Furthermore, the passivation layer 122 overlies the oxide layer 120 around the outgassing region 141. In various embodiments, the passivation layer 122 may include one or more layers. For example, the passivation layer 122 may include a SiN layer and/or a silicon rich oxide ("SRO") layer.

Figure 6:
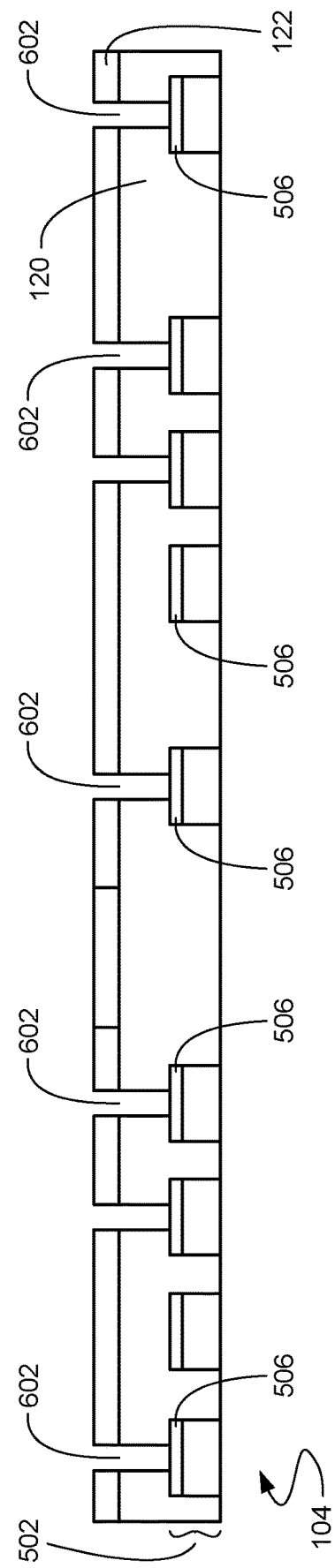
FIG. 6 shows the CMOS wafer including vias according to one aspect of the present embodiments.

Referring now to FIG. 6, the CMOS wafer 104 including vias 602 is shown according to one aspect of the present embodiments. Vias 602 have been formed (e.g. etched) in the passivation layer 122 and the oxide layer 120. The vias 602 are trenches that expose a portion of the metal layer 502 corresponding to one or more of the electrodes 126, 128, 130, 132. 134, and/or 138 (FIG. 2). In the illustrated embodiment, the vias 602 expose the Ti layer 506 corresponding to the bonding electrodes 138 (FIG. 2), the sensing electrodes 126 and 132 (FIG. 2), and the bump stop electrodes 128 and 134 (FIG. 2).

It is understood that the illustrated embodiment corresponds to the embodiments illustrated in FIGS. 2 and 3. However, the embodiment illustrated in FIG. 1 includes the shield electrode 130 with a corresponding via that may be formed as discussed above.

Figure 7:
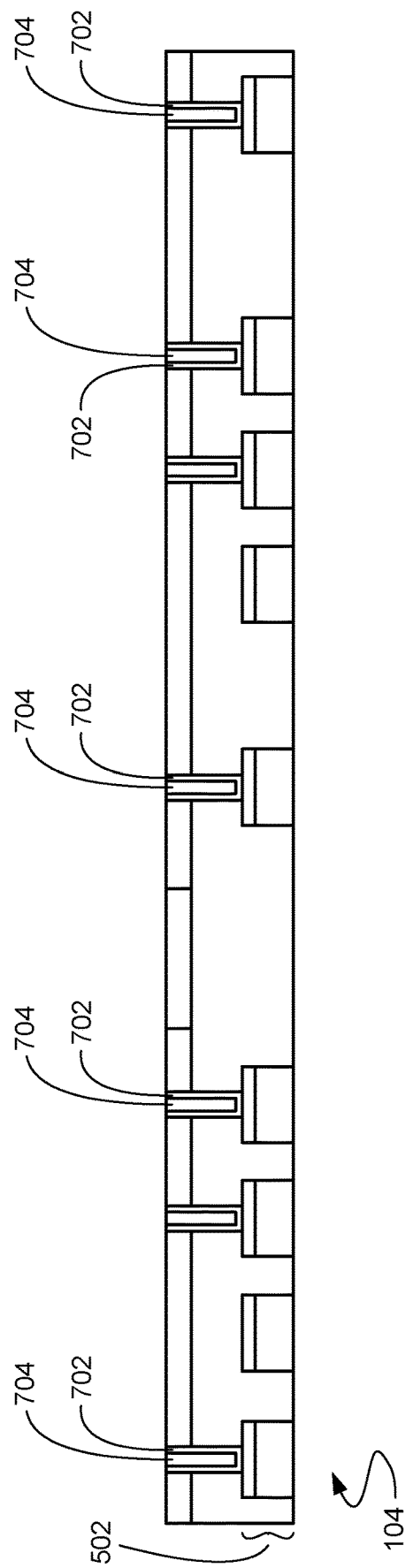
FIG. 7 shows the CMOS wafer after the vias have been filled according to one aspect of the present embodiments.

Referring now to FIG. 7, the CMOS wafer 104 after the vias 602 (FIG. 6) have been filled is shown according to one aspect of the present embodiments. The vias 602 (FIG. 6) have had their trenches coated with a liner 702. For example, TiN may be used to line the trenches under the electrodes 126, 128, 130, 132. 134, and/or 138 (FIG. 2). In the illustrated embodiment, the TiN lined trenches are under the electrodes corresponding to the bonding electrodes 138 (FIG. 2), the sensing electrodes 126 and 132 (FIG. 2), and the bump stop electrodes 128 and 134 (FIG. 2). The lined trenches are then filled, thereby forming a connection between the corresponding electrode and metal layer 502. For example, tungsten vias 704 connect the bonding electrodes 138 (FIG. 2), the sensing electrodes 126 and 132 (FIG. 2), and the bump stop electrodes 128 and 134 (FIG. 2) to corresponding metal layers 502. In various embodiments, the bump stop electrodes 128 and 134 (FIG. 2) include TiN, Ti, or Tungsten. As such, in various embodiments, a conducive bump stop may be formed, for example, that includes the bump stop electrode 128, the TiN lined trench (e.g. the liner 702), and the tungsten via 704 connecting the bump stop electrode 128 to the metal layer 502.

It is understood that the illustrated embodiment corresponds to the embodiments illustrated in FIGS. 2 and 3. However, the embodiment illustrated in FIG. 1 includes the shield electrode 130 with a corresponding liner and tungsten via that may be formed as discussed above.

Referring now to FIG. 8, the CMOS wafer 104 after electrode deposition and patterning is shown according to one aspect of the present embodiments. An electrode layer 802 (e.g. TiN) has been deposited and patterned into one or more of the electrodes 126, 128, 130, 132. 134, and/or 138 (FIG. 2). In addition, the getter layer 158 (e.g. Ti) has been deposited and patterned overlying the electrode layer 802. It is understood that in various embodiments the getter layer 158 may also be referred to as a top electrode layer.

Furthermore, a first bonding metal layer 804 (e.g. AlCu) has been deposited and patterned overlying the getter layer 158 and/or the electrode layer 802. It is understood that the patterning may form the getter layer 158 over one, some, or all of the electrodes. In various embodiments, the electrode layer 802, the getter layer 158, and the first bonding metal layer 804 may be patterned using one or more photoresist masks (not shown).

It is understood that the illustrated embodiment corresponds to the embodiments illustrated in FIGS. 2 and 3. However, the embodiment illustrated in FIG. 1 includes the shield electrode 130 with a corresponding electrode layer, getter layer, and first bonding metal layer that may be formed as discussed above.

Referring now to FIG. 9, the CMOS wafer 104 after selective etch of the first bonding metal layer 804 is shown according to one aspect of the present embodiments. The first bonding layer 804 has been etched (e.g. wet etched) using another photoresist mask (not shown) to remove the first bonding metal 136 on the bump stop electrodes 128 and 134 and the sensing electrodes 126 and 132, thereby exposing the bump stop electrodes 128 and 134 and the sensing electrodes 126 and 132. As a result, the first bonding metal 136 remains overlying the bonding electrode 138. It is understood that in various embodiments, there may be more than one bonding electrode with overlying first bonding metal.

It is understood that the illustrated embodiment corresponds to the embodiments illustrated in FIGS. 2 and 3. However, the embodiment illustrated in FIG. 1 includes the shield electrode 130 with selective etch of the first bonding metal layer that may occur as discussed above.

Referring now to FIG. 10, the CMOS wafer 104 after selective etch of the getter layer 158 is shown according to one aspect of the present embodiments. The getter layer 158 has been etched (e.g. wet etched) using another photoresist mask (not shown) to remove the getter layer 158 on the bump stop electrode 128 and the sensing electrode 126, thereby exposing the bump stop electrode 128 and the sensing electrode 126. As a result, the getter layer 158 remains overlying the bonding electrode 138, the bump stop electrode 134 and the sensing electrode 132.

It is understood that the illustrated embodiment corresponds to the embodiments illustrated in FIGS. 2 and 3. However, the embodiment illustrated in FIG. 1 includes the shield electrode 130 with a corresponding overlying getter layer that may be formed as discussed above.

After FIG. 10, the process may proceed through Process A (FIGS. 11A and 11B), Process B (FIGS. 12A and 12B), or Process C (FIGS. 13A and 13B). Process A, B, and C will be described below. It is understood that Process A corresponds to the embodiment described in FIG. 1, Process B corresponds to the embodiment described in FIG. 2, and Process C corresponds to the embodiment described in FIG. 3.

Referring now to FIG. 11A, Process A of the CMOS wafer 104 after passivation etch is shown according to one aspect of the present embodiments. The passivation layer 122 and the oxide layer 120 have been etched (e.g. with a mask), thereby forming the third cavity 142. It is understood that in various embodiments more cavities may be formed. Therefore, the etching exposes the shield electrode 124 within in the third cavity 142 in the oxide layer 120, adjacent to the sensing electrode 126.

Therefore, for example, the bonding electrode 138, the sensing electrode 126, and the bump stop electrode 128 overly the passivation layer 122. The shield electrode 124 is positioned adjacent to the bump stop electrode 128 and the bonding electrode 138. However, the shield electrode 124 does not overly the passivation layer 122. Instead the shield electrode 124 is in the third cavity 142 in the oxide layer 120 that was formed by removing a portion of the passivation layer 122 and the oxide layer 120. As such, the shield electrode 124 is lower than the passivation layer 122, the sensing electrode 126, the bump stop electrode 128, and the bonding electrode 138.

It is understood that the overlying Ti layer 506 (FIG. 5) acts as a getter layer (e.g. the getter layer 158). Therefore, the Ti layer 506 (FIG. 5) is removed (e.g. etched) from the shield electrode 124. In various embodiments, the shield electrode 124 may be any conductive metal or composition (e.g. AlCu). On the other hand, the getter layer 158 remains overlying the shield electrode 130, the sensing electrode 132, and the bump stop electrode 134.

Referring now to FIG. 11B, Process A of the CMOS wafer 104 and the MEMS wafer 102 after eutectic bonding is shown according to one aspect of the present embodiments. The MEMS wafer 102 and the CMOS wafer 104 are connected by the eutectic bond 135 between the first bonding metal 136 and the second bonding metal 140. The eutectic bonding forms the sensing gaps 146 and 152 positioned between the corresponding sensing electrodes 126 and 132 and the device layer 106. In addition, the eutectic bonding forms the bump stop gaps 150 and 156 positioned between the corresponding bump stop electrodes 128 and 134 and the device layer 106. Furthermore, the eutectic bonding forms the shield gaps 144 and 154 positioned between the corresponding shield electrodes 124 and 130 and the device layer 106. According to embodiments described herein, the sensing gap 146 is greater than the bump stop gap 150, and the shield gap 144 is greater than the sensing gap 146. Furthermore, the sensing gap 152 and the shield gap 154 are greater than the bump stop gap 156.

Referring now to FIG. 12A, Process B of the CMOS wafer 104 after passivation etch is shown according to one aspect of the present embodiments. The passivation layer 122 and the oxide layer 120 have been etched (e.g. with a mask), thereby forming the third cavity 142 and the fourth cavity 202. It is understood that in various embodiments more cavities may be formed. Therefore, the etching exposes the shield electrode 124 within the third cavity 142 in the oxide layer 120, adjacent to the sensing electrode 126. In addition, the etching exposes the shield electrode 130 within the fourth cavity 202 in the oxide layer 120, adjacent to the sensing electrode 132.

Therefore, for example, the bonding electrode 138, the sensing electrode 126, and the bump stop electrode 128 overly the passivation layer 122. The shield electrode 124 is positioned adjacent to the bump stop electrode 128 and the bonding electrode 138. However, the shield electrode 124 does not overly the passivation layer 122. Instead the shield electrode 124 is in the third cavity 142 in the oxide layer 120 that was formed by removing a portion of the passivation layer 122 and the oxide layer 120. As such, the shield electrode 124 is lower than the passivation layer 122, the sensing electrode 126, the bump stop electrode 128, and the bonding electrode 138.

Likewise, the sensing electrode 132 and the bump stop electrode 134 overly the passivation layer 122. The shield electrode 130 is positioned adjacent to the bump stop electrode 134 and the bonding electrode 138. However, the shield electrode 130 does not overly the passivation layer 122. Instead the shield electrode 130 is in the fourth cavity 202 in the oxide layer 120 that was formed by removing a portion of the passivation layer 122 and the oxide layer 120. As such, the shield electrode 130 is lower than the passivation layer 122, the sensing electrode 132, the bump stop electrode 134, and the bonding electrode 138.

It is understood that the overlying Ti layer 506 (FIG. 5) acts as a getter layer (e.g. the getter layer 158). Therefore, the Ti layer 506 (FIG. 5) is removed (e.g. etched) from the shield electrode 124. In various embodiments, the shield electrode 124 may be any conductive metal or composition (e.g. AlCu). On the other hand, the Ti layer 506 (FIG. 5) remains overlying the shield electrode 130, functioning as the getter layer 158. In addition, the getter layer 158 remains overlying the sensing electrode 132 and the bump stop electrode 134. In various embodiments, the shield electrode 124 may be any conductive metal or composition (e.g. AlCu).

Referring now to FIG. 12B, Process B of the CMOS wafer 104 and the MEMS wafer 102 after eutectic bonding is shown according to one aspect of the present embodiments. The MEMS wafer 102 and the CMOS wafer 104 are connected by the eutectic bond 135 between the first bonding metal 136 and the second bonding metal 140. The eutectic bonding forms the sensing gaps 146 and 152 positioned between the corresponding sensing electrodes 126 and 132 and the device layer 106. In addition, the eutectic bonding forms the bump stop gaps 150 and 156 positioned between the corresponding bump stop electrodes 128 and 134 and the device layer 106. Furthermore, the eutectic bonding forms the shield gaps 144 and 154 positioned between the corresponding shield electrodes 124 and 130 and the device layer 106. According to embodiments described herein, the sensing gap 146 is greater than the bump stop gap 150, and the shield gap 144 is greater than the sensing gap 146. Furthermore, the sensing gap 152 is greater than the bump stop gap 156, and the shield gap 154 is greater than the sensing gap 152.

Referring now to FIG. 13A, Process C of the CMOS wafer 104 after passivation etch is shown according to one aspect of the present embodiments. Process C is similar to Process B. However, in Process C the getter layer 158 only remains on the shield electrode 130 and is removed from the other electrodes 124, 126, 128, 132, and 134.

The passivation layer 122 and the oxide layer 120 have been etched (e.g. with a mask), thereby forming the third cavity 142 and the fourth cavity 202. It is understood that in various embodiments more cavities may be formed. Therefore, the etching exposes the shield electrode 124 within the third cavity 142 in the oxide layer 120, adjacent to the sensing electrode 126. In addition, the etching exposes the shield electrode 130 in the fourth cavity 202, adjacent to the sensing electrode 132.

Therefore, for example, the bonding electrode 138, the sensing electrode 126, and the bump stop electrode 128 overly the passivation layer 122. The shield electrode 124 is positioned adjacent to the bump stop electrode 128 and the bonding electrode 138. However, the shield electrode 124 does not overly the passivation layer 122. Instead the shield electrode 124 is in the third cavity 142 in the oxide layer 120 that was formed by removing a portion of the passivation layer 122 and the oxide layer 120. As such, the shield electrode 124 is lower than the passivation layer 122, the sensing electrode 126, the bump stop electrode 128, and the bonding electrode 138.

Likewise, the sensing electrode 132 and the bump stop electrode 134 overly the passivation layer 122. The shield electrode 130 is positioned adjacent to the bump stop electrode 134 and the bonding electrode 138. However, the shield electrode 130 does not overly the passivation layer 122. Instead the shield electrode 130 is in the fourth cavity 202 in the oxide layer 120 that was formed by removing a portion of the passivation layer 122 and the oxide layer 120. As such, the shield electrode 130 is lower than the passivation layer 122, the sensing electrode 132, the bump stop electrode 134, and the bonding electrode 138.

It is understood that the overlying Ti layer 506 (FIG. 5) acts as a getter layer (e.g. the getter layer 158). Therefore, the Ti layer 506 (FIG. 5) is removed (e.g. etched) from the shield electrode 124. In various embodiments, the shield electrode 124 may be any conductive metal or composition (e.g. AlCu). On the other hand, the Ti layer 506 (FIG. 5) remains overlying the shield electrode 130, functioning as the getter layer 158. In various embodiments, the shield electrode 124 may be any conductive metal or composition (e.g. AlCu).

Referring now to FIG. 13B, Process C of the CMOS wafer 104 and the MEMS wafer 102 after eutectic bonding is shown according to one aspect of the present embodiments. The MEMS wafer 102 and the CMOS wafer 104 are connected by the eutectic bond 135 between the first bonding metal 136 and the second bonding metal 140. The eutectic bonding forms the sensing gaps 146 and 152 positioned between the corresponding sensing electrodes 126 and 132 and the device layer 106. In addition, the eutectic bonding forms the bump stop gaps 150 and 156 positioned between the corresponding bump stop electrodes 128 and 134 and the device layer 106. Furthermore, the eutectic bonding forms the shield gaps 144 and 154 positioned between the corresponding shield electrodes 124 and 130 and the device layer 106. According to embodiments described herein, the sensing gap 146 is greater than the bump stop gap 150, and the shield gap 144 is greater than the sensing gap 146. Furthermore, the sensing gap 152 is greater than the bump stop gap 156, and the shield gap 154 is greater than the sensing gap 152.

FIG. 14 shows an exemplary flow diagram according to one aspect of the present embodiments. At block 1402, a MEMS wafer including a device layer and a handle substrate bonded to the device layer is formed. At block 1404, a CMOS wafer including an oxide layer, and a passivation layer overlying the oxide layer is formed. At block 1406, a bonding electrode overlying the passivation layer, a sensing electrode overlying the passivation layer, and a bump stop electrode overlying the passivation layer is formed. At block 1408, the passivation layer and the oxide layer are etched, wherein the etching exposes a shield electrode.

At block 1410, the MEMS wafer is eutecticly bonded to the CMOS wafer. The eutectic bonding includes forming a eutectic bond between a first bonding metal on the bonding electrode and a second bonding metal on the MEMS wafer. Furthermore, the eutectic bonding forms a sensing gap between the sensing electrode and the device layer. In addition, the eutecticly bonding forms a shield gap between the shield electrode and the device layer, wherein the sensing gap is smaller than the shield gap.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. An apparatus comprising:
    a micro-electro-mechanical system ("MEMS") wafer including a device layer and a handle substrate bonded to the device layer;
    a complementary metal-oxide semiconductor ("CMOS") wafer including an oxide layer, and a passivation layer overlying the oxide layer;
    a bonding electrode overlying the passivation layer;
    a eutectic bond between a first bonding metal on the bonding electrode and a second bonding metal on the MEMS wafer;
    a sensing electrode overlying the passivation layer;
    a shield electrode adjacent to the sensing electrode; and
    a sensing gap positioned between the sensing electrode and the device layer, wherein the sensing gap is smaller than a shield gap positioned between the shield electrode and the device layer.

2. The apparatus of claim 1, further comprising a bump stop electrode overlying the passivation layer.

3. The apparatus of claim 2, further comprising a bump stop gap positioned between the bump stop electrode and the device layer, wherein the bump stop gap is smaller than the sensing gap and the shield gap.

4. The apparatus of claim 2, wherein the bump stop electrode includes TiN, Ti, or Tungsten.

5. The apparatus of claim 2, further comprising a bump stop including the bump stop electrode, a TiN lined trench, and a tungsten via connecting the bump stop electrode to a metal layer.

6. The apparatus of claim 1, further comprising an outgassing region over a portion of the oxide layer.

7. The apparatus of claim 6, wherein the outgassing region includes high density plasma ("HDP") oxide.

8. The apparatus of claim 1, wherein the shield electrode is within a cavity in the oxide layer.

9. An apparatus comprising:
    a micro-electro-mechanical system ("MEMS") wafer including a device layer, comprising a first MEMS device, a second MEMS device, and a handle substrate bonded to the device layer;
    a complementary metal-oxide semiconductor ("CMOS") wafer including an oxide layer, and a passivation layer overlying the oxide layer;
    a bonding electrode overlying the passivation layer;
    a eutectic bond between a first bonding metal on the bonding electrode and a second bonding metal on the MEMS wafer, wherein the eutectic bond separates the first MEMS device from the second MEMS device;
    a first sensing electrode overlying the passivation layer, wherein the first sensing electrode is under the first MEMS device;
    a second sensing electrode overlying the passivation layer, wherein the second sensing electrode is under the second MEMS device;
    a first shield electrode, wherein the first shield electrode is within a first cavity in the first MEMS device;
    a second shield electrode, wherein the second shield electrode is within a second cavity in the second MEMS device;
    a first sensing gap positioned between the first sensing electrode and the device layer, wherein the first sensing gap is smaller than a first shield gap positioned between the first shield electrode and the device layer.

10. The apparatus of claim 9, wherein the second shield electrode overlies the passivation layer.

11. The apparatus of claim 9, wherein the first shield electrode is within a third cavity in the oxide layer and the second shield electrode is within a fourth cavity in the oxide layer.

12. The apparatus of claim 9, further comprising a first bump stop electrode in the first cavity and a second bump stop electrode in the second cavity, the first and second bump stop electrodes overlying the passivation layer, wherein the first and second bump stop electrodes include TiN, Ti, or tungsten.

13. The apparatus of claim 9, further comprising a Ti getter layer overlying the second shield electrode.

14. The apparatus of claim 9, further comprising a second sensing gap positioned between the second sensing electrode and the device layer, wherein the second sensing gap is smaller than a second shield gap positioned between the second shield electrode and the device layer.

15. The apparatus of claim 9, wherein the first bonding metal includes Al and the second bonding metal includes Ge.

16. A method comprising:
   forming a micro-electro-mechanical system ("MEMS") wafer including a device layer and a handle substrate bonded to the device layer;
   forming a complementary metal-oxide semiconductor ("CMOS") wafer including an oxide layer, and a passivation layer overlying the oxide layer;
   forming a bonding electrode overlying the passivation layer, a sensing electrode overlying the passivation layer, and a bump stop electrode overlying the passivation layer;
   etching the passivation layer and the oxide layer, wherein the etching exposes a shield electrode; and
   eutecticly bonding the MEMS wafer to the CMOS wafer, wherein
      the eutecticly bonding includes forming a eutectic bond between a first bonding metal on the bonding electrode and a second bonding metal on the MEMS wafer,
      the eutecticly bonding forms a sensing gap between the sensing electrode and the device layer,
      the eutecticly bonding forms a shield gap between the shield electrode and the device layer, and
      the sensing gap is smaller than the shield gap.

17. The method of claim 16, wherein
the eutecticly bonding forms a bump stop gap between the bump stop electrode and the device layer, and
the bump stop gap is smaller than the sensing gap and the shield gap.

18. The method of claim 16, further comprising forming a bump stop, wherein the bump stop includes the bump stop electrode and a TiN lined trench under the bump stop electrode.

19. The method of claim 16, further comprising forming a bump stop, wherein the bump stop includes the bump stop electrode and a tungsten via under the bump stop electrode.

20. The method of claim 16, wherein the sensing electrode includes TiN, Ti, or Tungsten.

21. A method comprising:
   forming a micro-electro-mechanical system ("MEMS") wafer including a device layer and a handle substrate bonded to the device layer;
   forming a complementary metal-oxide semiconductor ("CMOS") wafer including an oxide layer, and a passivation layer overlying the oxide layer;
   forming a first bonding electrode overlying the passivation layer, a first sensing electrode overlying the passivation layer, a first bump stop electrode overlying the passivation layer, and a first shield electrode overlying the passivation layer in a first cavity;
   forming a second bonding electrode overlying the passivation layer, a second sensing electrode overlying the passivation layer, and a second bump stop electrode overlying the passivation layer in a second cavity
   etching the passivation layer and the oxide layer in the second cavity, wherein the etching exposes a second shield electrode; and
   eutecticly bonding the MEMS wafer to the CMOS wafer, wherein
      the eutecticly bonding includes forming a eutectic bond between a first bonding metal on the first and second bonding electrodes and a second bonding metal on the MEMS wafer,
      the eutecticly bonding forms a first and second sensing gaps between the first and second sensing electrodes and the device layer,
      the eutecticly bonding forms a first and second shield gaps between the first and second shield electrodes and the device layer, and
      the second sensing gap is smaller than the second shield gap.

* * * * *